(12) United States Patent
Jacobson et al.

(10) Patent No.: US 7,204,900 B1
(45) Date of Patent: Apr. 17, 2007

(54) METHOD OF FABRICATING STRUCTURES USING LOW TEMPERATURE COFIRED CERAMICS

(75) Inventors: Rena Y. Jacobson, Ellicott City, MD (US); Tapan K. Gupta, Ellicott City, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 2 days.

(21) Appl. No.: 10/909,541

(22) Filed: Aug. 3, 2004

Related U.S. Application Data

(60) Provisional application No. 60/566,074, filed on Apr. 29, 2004.

(51) Int. Cl.
*B32B 37/02* (2006.01)
*B32B 38/04* (2006.01)

(52) U.S. Cl. .............................. 156/89.11; 156/89.12; 156/182; 156/252; 156/253; 156/256

(58) Field of Classification Search ............. 156/89.11, 156/89.12, 182, 252, 253, 256
See application file for complete search history.

(56) References Cited

U.S. PATENT DOCUMENTS

| | | | | | |
|---|---|---|---|---|---|
| 4,443,278 | A | * | 4/1984 | Zingher ..................... | 156/64 |
| 4,806,295 | A | * | 2/1989 | Trickett et al. .......... | 156/89.22 |
| 5,102,720 | A | * | 4/1992 | Raj ............................ | 428/209 |
| 5,435,875 | A | * | 7/1995 | Saitoh et al. ............... | 156/245 |
| 5,480,503 | A | * | 1/1996 | Casey et al. ............. | 156/89.18 |
| 5,575,872 | A | * | 11/1996 | Tsukada et al. .......... | 156/89.15 |
| 5,792,293 | A | * | 8/1998 | Inasaka ................... | 156/89.16 |
| 5,855,803 | A | | 1/1999 | Bailey et al. | |
| 5,858,145 | A | * | 1/1999 | Sreeram et al. .......... | 156/89.16 |
| 6,245,185 | B1 | * | 6/2001 | Bezama et al. ............. | 156/252 |
| 6,406,778 | B1 | * | 6/2002 | Natarajan et al. ........... | 428/209 |
| 6,592,696 | B1 | * | 7/2003 | Burdon et al. ........... | 156/89.12 |
| 6,676,784 | B2 | * | 1/2004 | Setzer et al. ............. | 156/89.12 |
| 2005/0109453 | A1 | * | 5/2005 | Jacobson et al. ........... | 156/253 |
| 2005/0241128 | A1 | * | 11/2005 | Berry et al. ............... | 29/25.41 |

FOREIGN PATENT DOCUMENTS

| | | | |
|---|---|---|---|
| JP | 1-205595 | * | 8/1989 |
| JP | 5-75263 | * | 3/1993 |
| JP | 9-129486 | * | 5/1997 |
| JP | 2001-7534 | * | 1/2001 |
| JP | 2001-102240 | * | 4/2001 |
| JP | 2003-77756 | * | 2/2003 |
| JP | 2004-34448 | * | 2/2004 |

* cited by examiner

*Primary Examiner*—Melvin C. Mayes
(74) *Attorney, Agent, or Firm*—Birch, Stewart, Kolasch & Birch, LLP (57) ABSTRACT

Disclosed is a method of forming an LTCC structure that involves providing at least a first ceramic tape sheet, laminating at least a second ceramic tape sheet to the at least a first ceramic tape sheet to form a substructure, laminating at least a third ceramic tape sheet to the substructure to form an intermediate structure, and laminating at least a fourth ceramic tape sheet to the intermediate structure to form an LTCC structure.

19 Claims, 7 Drawing Sheets

METHOD OF FABRICATING STRUCTURES USING LOW TEMPERATURE COFIRED CERAMICS

CROSS REFERENCE TO RELATED APPLICATIONS

The present application claims the benefit of U.S. Provisional Patent Application No. 60/566,074, filed Apr. 29, 2004, the entire contents of which are hereby incorporated by reference.

FIELD OF THE INVENTION

The present invention is directed toward a method of forming a low temperature co-fired ceramic (LTCC) structure, and, more specifically, toward a method of forming an LTCC structure having slots, sockets or cavities using at least two separate laminating steps.

BACKGROUND OF THE INVENTION

Multilayered ceramic structures may be used to form electronic devices such as ceramic capacitors, multilayered ceramic integrated circuits (MCIC), multichip modules, integrated circuit packaging, high temperature sensors (such as exhaust gas sensors), fuel cells, and fuel cell reformer systems. Multilayered structures also find application in transmit/receive modules in phased array radars. These devices may be used as substrates to support and interconnect electronic components mounted thereon, and, to this end, may include open cavities on one or more surfaces for receiving the electronic components.

Such multilayered structures are often made by laminating together layers or sheets of unfired ceramic tape, known in the art as "green-tape," and then firing the laminated layers to form a finished structure. Green tape is commercially available, for example, from the DuPont Company under the product designation #951AT. The tape contains a material formulation which can be a mixture of glass and ceramic fillers which sinter at about 850° C., and exhibits thermal expansion similar to alumina. Low-temperature processing permits the use of air-fired resistors and precious metal thick film conductors such as gold, silver, or their alloys.

In electronic applications, one or more of the green-tape layers may include metallized portions to provide conduction pathways for electrical current in the finished multilayered structure. The green-tape layers may also have portions punched out to define vias, channels, or cavities. A method of forming cavities in a multilayer LTCC substrate is disclosed, for example, in U.S. Pat. No. 5,855,803, entitled "Template Type Cavity-Formation Device for Low Temperature Cofired Ceramic (LTCC) Sheets" which patent is hereby incorporated by reference.

Figure 1:
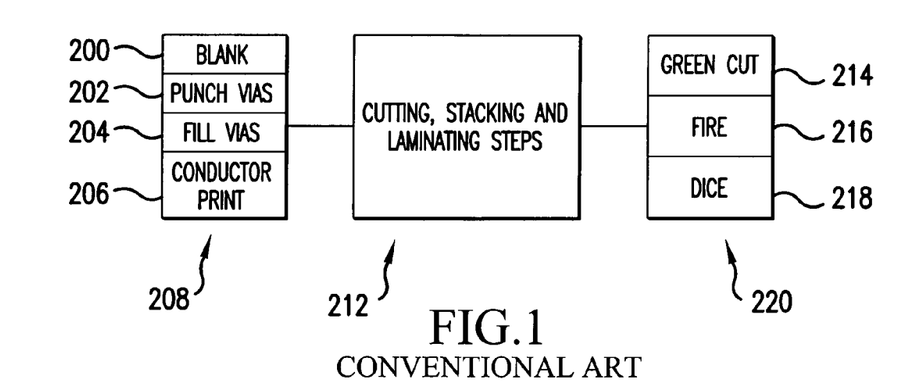
FIG. 1 is a flow chart providing an overview of the steps involved in forming LTCC structures.

A conventional method of forming cavities and other openings in a LTCC is by routing or laser cutting openings in each of a plurality of sheets of green tape then stacking and laminating the sheets to form a finished product. FIG. 1 illustrates an overview of the steps involved in a conventional LTCC forming process. At a first step 200, sheets of ceramic tape are blanked, or cut to size from a roll of "green" or unfired ceramic tape. The tape sheets are then stabilized, if necessary, and punched at a step 202 to form vias or other openings that will provide interconnection between the layers when filled with a conductive paste at step 204, often using a printing process that uses a stencil. At step 206, a screen printing process is used to print conductor patterns on the tape sheets. These initial steps 200, 202, 204 and 206 are referred to hereinafter jointly as initial processing steps 208.

Next, various cutting, stacking and laminating steps, designated generally by block 212 in FIG. 1, are carried out. These steps involve cutting openings in the individual sheets using, for example, a routing, laser cutting, or template cutting process. The sheets are then stacked on tooling pins in a given order to form a panel and laminated in an isostatic bath at a pressure of about 3000 psi to make the sheets or layers mold together into a single dense unit.

After the intermediate steps of block 212, the laminated LTCC structure is placed on a router, and the tooling holes are cut away at a step 214. Next, the panel is placed in a furnace and fired at a step 216 to form a fired ceramic panel. The panel is diced into individual parts at step 218.

Steps 212, 214, 216, 218 may be referred to together hereinafter as finishing steps 220. The initial processing steps 208 and finishing steps 220 are conventional and will not be discussed in detail hereinafter. It should also be noted, however, that the initial processing steps 208 and the finishing steps 220 are illustrative only, and, while they are generally useful in the formation of LTCC structures, they can be changed without affecting the intermediate steps discussed hereinafter in connection with various embodiments of the present invention.

The above described method cannot easily be used to form an LTCC having slots or sockets because the single tape sheets cannot withstand the pressure of the isostatic bath. The material covering the slot will collapse into the opening during final lamination and destroy the product. Therefore, different combinations of intermediate steps have been considered for providing improved LTCC products.

Figure 2:
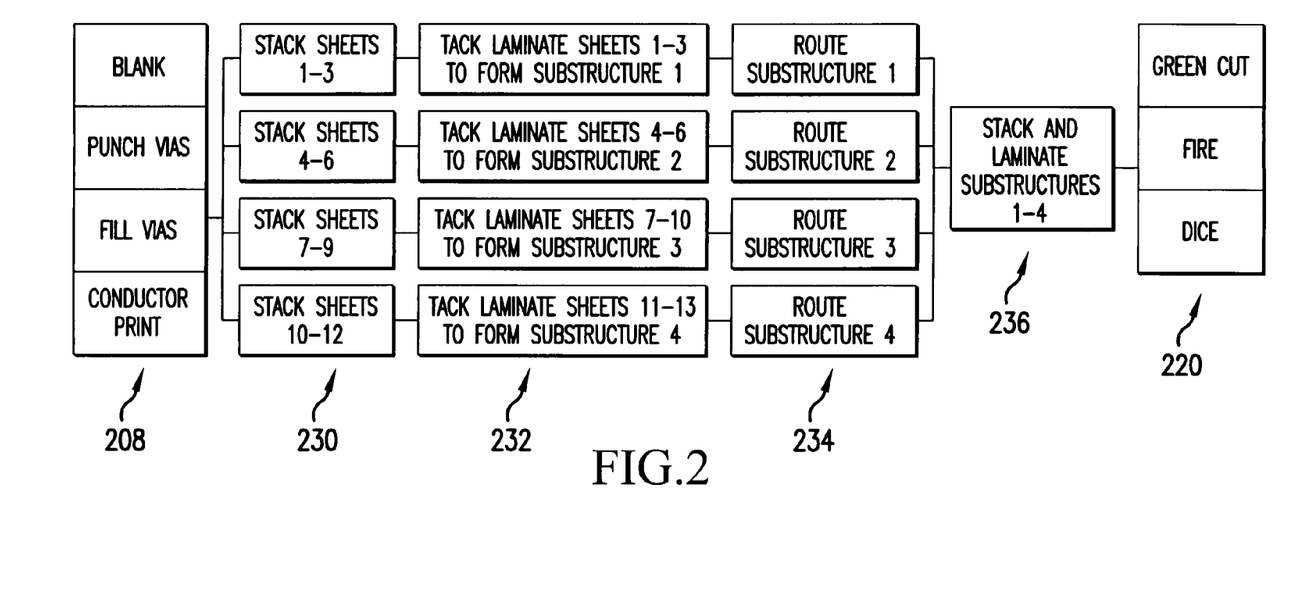
FIG. 2 is a flow chart illustrating steps for forming LTCC structures having cavities, slots and/or sockets.

One series of intermediate steps used to form an LTCC structure is described in co-pending U.S. patent application Ser. No. 10/718,805, filed Nov. 23, 2003, assigned to the assignee of the present application and the contents of which are hereby incorporated by reference. FIG. 2 illustrates a simplified version of the process disclosed in that copending application wherein first, second, third and fourth stacks of three sheets of green tape are stacked at step 230. (Each stack includes three sheets to simplify the drawings and discussion. Different numbers of sheets are discussed in the above-referenced application.) The stacks of sheets are then pre-laminated or tack laminated at step 232 in order to form first, second, third and fourth substructures. Some the substructures are routed or otherwise processed to form openings therein at step 234, and the four substructures are stacked and undergo a final lamination step at step 236, before the aforementioned finishing steps 220 are performed.

While useful products are produced by this method, it also produces a large percentage of defective products. Yield using this method has been found to be less than 50 percent. It would therefore be desirable to find a method for producing LTCC products having slots, sockets and/or cavities that had a lower defect rate than processes such as the one described above.

SUMMARY OF THE INVENTION

This problem and others are addressed by the present invention which comprises, in a first embodiment, a method of forming an LTCC structure that involves tack laminating a plurality of first stacks of ceramic tape sheets to form a plurality of substructures, tack laminating a second stack of ceramic tape to a first one of the plurality of substructures to form a first intermediate structure, tack laminating a third stack of ceramic tape to a second one of the plurality of substructures to form a second intermediate structure and laminating the first and second intermediate structures.

Another aspect of the invention comprises a method of forming an LTCC structure that involves laminating a first plurality of sheets of ceramic tape at a first pressure to form a first substructure, laminating a second plurality of sheets of ceramic tape at a second pressure to form a second substructure, laminating a third plurality of sheets of ceramic tape at a third pressure to form a third substructure, laminating the first substructure to the second substructure at a fourth pressure to form a first intermediate structure and laminating the third substructure and the first intermediate structure at a fifth pressure.

An additional aspect of the invention comprises a method of forming an LTCC structure that involves laminating a first plurality of sheets of ceramic tape at a first pressure to form a first substructure, laminating a second plurality of sheets of ceramic tape at a second pressure to form a second substructure, laminating a third plurality of sheets of ceramic tape at a third pressure to form a third substructure, laminating a fourth plurality of sheets of ceramic tape at a fourth pressure to form a fourth substructure, laminating the first substructure and the second substructure at a fifth pressure to form a first intermediate structure, laminating the third substructure and the fourth substructure at a sixth pressure to form a second intermediate structure and laminating the first intermediate structure and second intermediate structure.

In another aspect, the invention comprises a method of forming an LTCC structure that involves tack laminating a plurality of first stacks of ceramic tape sheets to form a plurality of substructures, providing a first plurality of ceramic tape sheets, forming a pattern of openings in the first plurality of ceramic sheets, stacking the first plurality of ceramic sheets with a second plurality of ceramic sheets to form a first stack, tack laminating the first stack to form an additional substructure and stacking and laminating the plurality of substructures and the additional substructure to form a panel.

A further aspect of the invention comprises a method of forming an LTCC structure that involves providing at least a first ceramic tape sheet, laminating at least a second ceramic tape sheet to the at least a first ceramic tape sheet to form a substructure, laminating at least a third ceramic tape sheet to the substructure to form an intermediate structure, and laminating at least a fourth ceramic tape sheet to the intermediate structure to form an LTCC structure.

Another aspect of the invention comprises a method of forming an LTCC structure that includes laminating a first plurality of sheets of ceramic tape at a first pressure to form a first substructure, laminating a second plurality of sheets of ceramic tape at a second pressure to form a second substructure, laminating a third plurality of sheets of ceramic tape at a third pressure to form a third substructure, laminating the first substructure to the second substructure at a fourth pressure less than the first, second and third pressures to form a first intermediate structure, and laminating the third substructure and the first intermediate structure at a fifth pressure.

A further aspect of the invention comprises a method of forming an LTCC structure that includes steps of laminating a first plurality of sheets of ceramic tape at a first pressure of about 3000 to 4000 psi to form a first substructure, laminating a second plurality of sheets of ceramic tape at a second pressure to form a second substructure, laminating a third plurality of sheets of ceramic tape at a third pressure to form a third substructure, laminating the first substructure to the second substructure at a fourth pressure to form a first intermediate structure, and laminating the third substructure and the first intermediate structure at a fifth pressure.

Yet another aspect of the invention comprises a method of forming an LTCC structure that includes laminating a first plurality of sheets of ceramic tape at a first pressure to form a first substructure, laminating a second plurality of sheets of ceramic tape at a second pressure greater than the first pressure to form a second substructure, laminating a third plurality of sheets of ceramic tape at a third pressure to form a third substructure, laminating a fourth plurality of sheets of ceramic tape at a fourth pressure to form a fourth substructure, laminating the first substructure and the second substructure at a fifth pressure to form a first intermediate structure, laminating the third substructure and the fourth substructure at a sixth pressure to form a second intermediate structure, and laminating the first intermediate structure and second intermediate structure.

An additional aspect of the invention comprises a method of forming an LTCC structure that includes laminating a first plurality of sheets of ceramic tape at a first pressure of about 3000 to 4000 psi to form a first substructure, laminating a second plurality of sheets of ceramic tape at a second pressure to form a second substructure, laminating a third plurality of sheets of ceramic tape at a third pressure to form a third substructure, laminating a fourth plurality of sheets of ceramic tape at a fourth pressure to form a fourth substructure, laminating the first substructure and the second substructure at a fifth pressure to form a first intermediate structure, laminating the third substructure and the fourth substructure at a sixth pressure to form a second intermediate structure, and laminating the first intermediate structure and second intermediate structure.

BRIEF DESCRIPTION OF THE DRAWINGS

These aspects of the invention and others will be better understood after a reading of the below detailed description together with the following drawings wherein.

DETAILED DESCRIPTION

Figure 3:
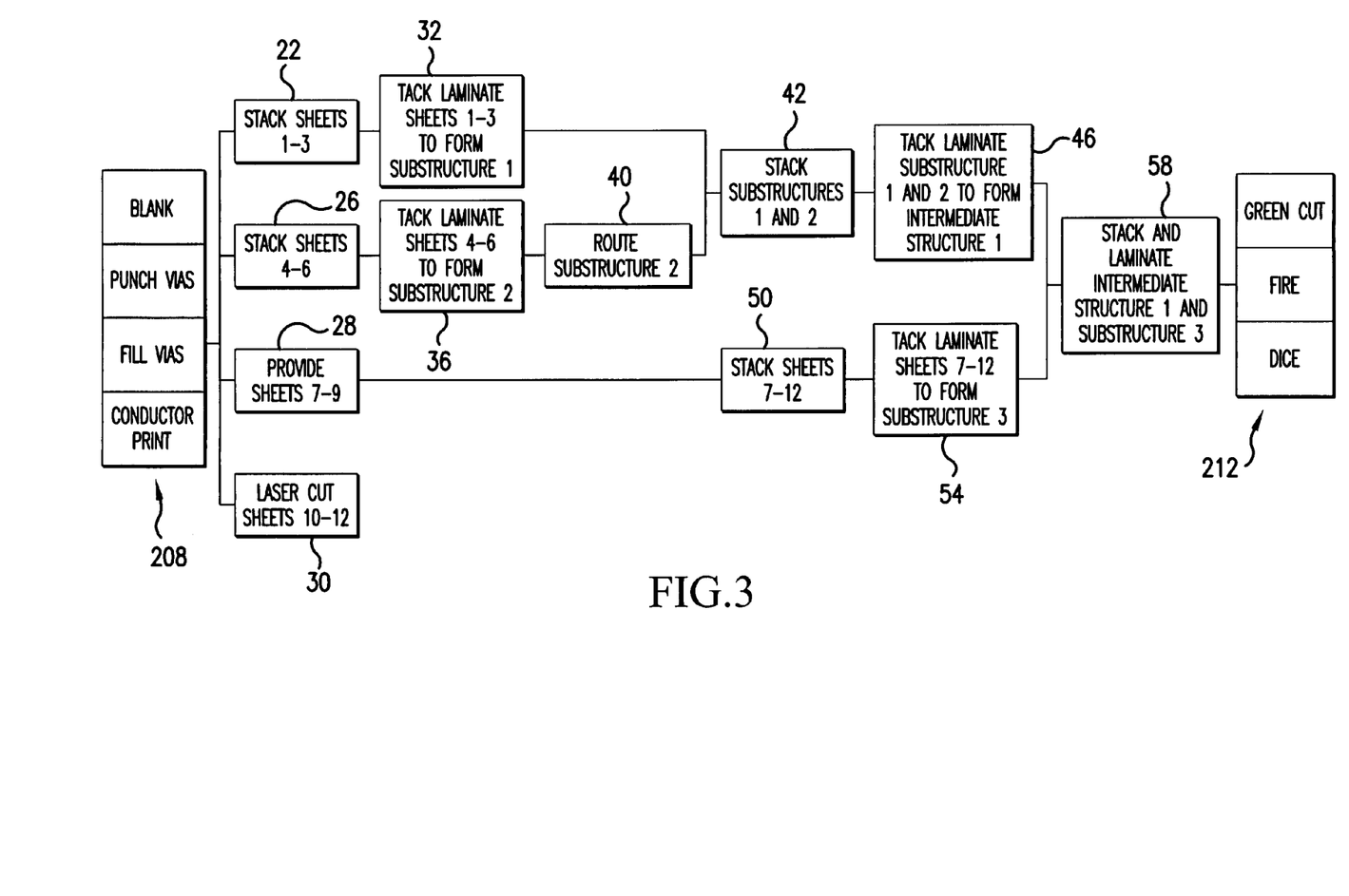
FIG. 3 is a flow chart illustrating a process for forming LTCC structures having cavities, slots, and/or sockets according to a first embodiment of the present invention.

Referring now to the drawings, wherein the showings are for purposes of illustrating embodiments of the invention only and not for the purpose of limiting same, FIG. 3 outlines the steps involved in forming LTCC structures according to a first embodiment of the present invention. In this embodiment, a process includes initial processing steps 208 and finishing steps 220; however, other initial steps and/or finishing steps could be used with the steps described hereafter without exceeding the scope of this invention. Examples of initial and finishing steps are merely provided to show how the steps of the claimed invention can be used to produce a finished LTCC product.

Figure 4:
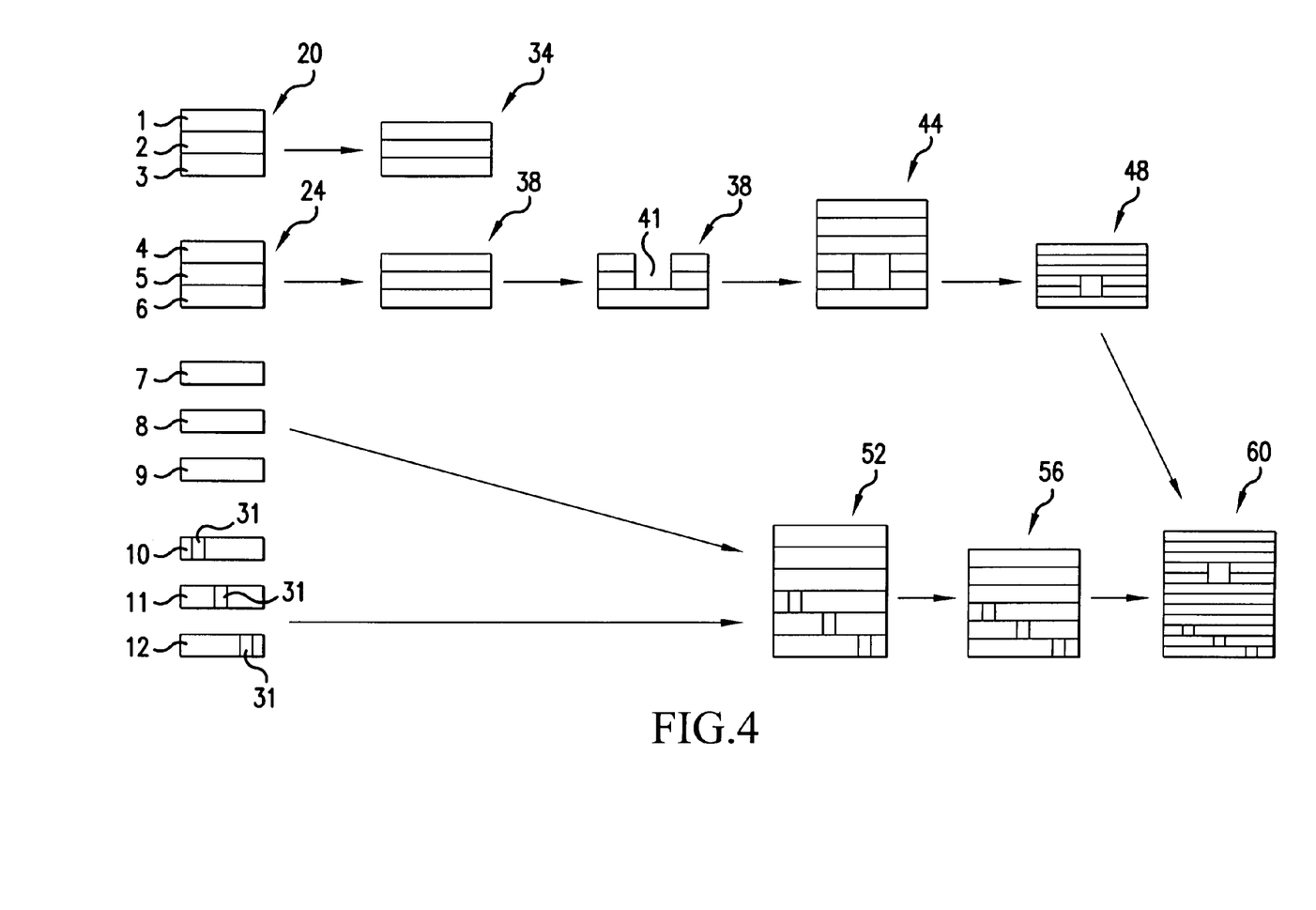
FIG. 4 schematically illustrates the structures formed by the process of FIG. 3.

The individual sheets or layers of green ceramic tape are identified by reference numerals 1–12 throughout this description and may be referred to hereinafter merely as "sheets" or "layers." Referring to FIGS. 3 and 4, in a first embodiment of the invention, a first stack 20 of three sheets 1, 2, 3 is formed at a step 22, a second stack 24 of three sheets 4, 5, 6 is formed at a step 26, a set of three sheets 7, 8, 9 is provided at step 28 and a set of three sheets 10, 11, 12 is provided at a step 30 and laser cut as necessary to form a desired pattern of openings 31 in the sheets.

Each of the first and second stacks 20, 24 and the groups of sheets 7–9 and 10–12 is illustrated as including three sheets or layers. While this embodiment of the present invention could be practiced with four stacks of three sheets each as described herein, the number of sheets in each stack may be less than or greater than three, and the number of sheets in one stack may differ from the number of sheets in another stack. The present embodiment of the invention is not limited to the stacks disclosed; the number three is merely used to allow for a clear discussion of these embodiments. Furthermore, cavities, slots and sockets will be formed in the panel based on the intended use of the finished panel manufactured by the method described herein. In the figures, single openings are used to illustrate schematically that openings have been formed; however, the invention is not limited to the formation of single openings, and in fact, the pattern of openings will generally be more complex than what is shown.

First stack 20 is subjected to a pre-lamination or tack-laminating process at step 32 to partially consolidate the sheets 1, 2, 3 into a first substructure 34. The tack lamination may be carried out, for example, for about 15 minutes at a pressure of about 3000 psi. This pressure and time is sufficient to partially bond the sheets of tape, but does not fully consolidate the sheets as is done during a conventional lamination step. The second stack 24 is tack laminated in a similar manner, for a similar time at a similar pressure, at a step 36 to form a second substructure 38, and this second substructure 38 is routed or otherwise processed at a step 40 to form a desired pattern of openings, illustrated schematically by a single opening 41.

The first substructure 34 and second substructure 38 are stacked at a step 42 to form a stack 44 and tack laminated at step 46 to form a first intermediate structure 48. This tack lamination step may be carried out, for example, for about 15 minutes at a pressure of about 2000 psi. Sheets 7–9 are stacked with the routed sheets 10–12 at step 50 to form a stack 52 and tack laminated at a step 54 for about 15 minutes at a pressure of about 3000 psi to form a third substructure 56. The first intermediate structure 48 and the third substructure 56 are stacked and laminated for about 15 minutes at a pressure of about 1500 psi at a step 58 to form a panel 60 and thereafter finishing steps 218 are carried out on the panel 60.

Figure 5:
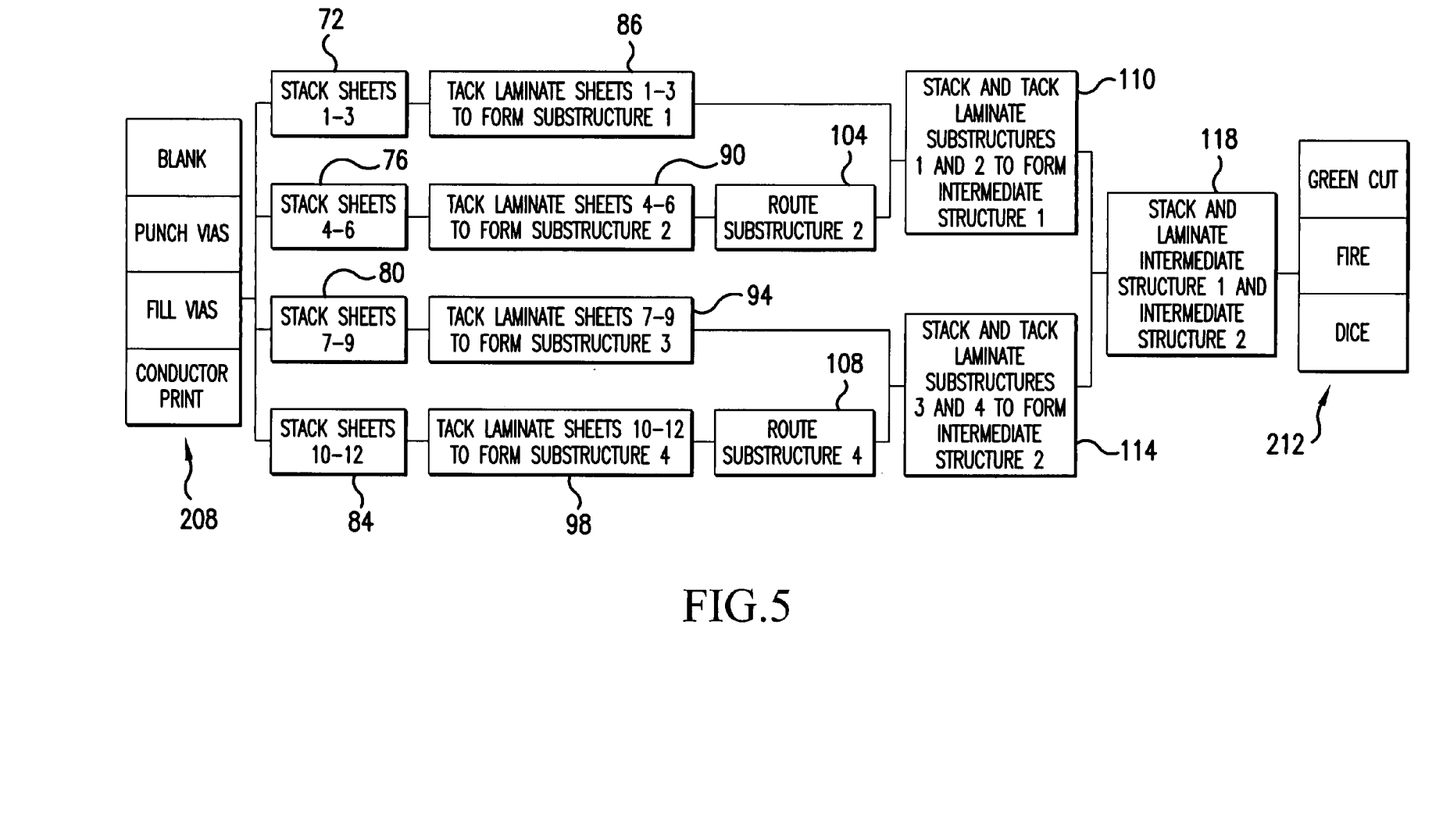
FIG. 5 is a flow chart illustrating a process for forming LTCC structures having cavities, slots, and/or sockets according to a second embodiment of the present invention.
Figure 6:
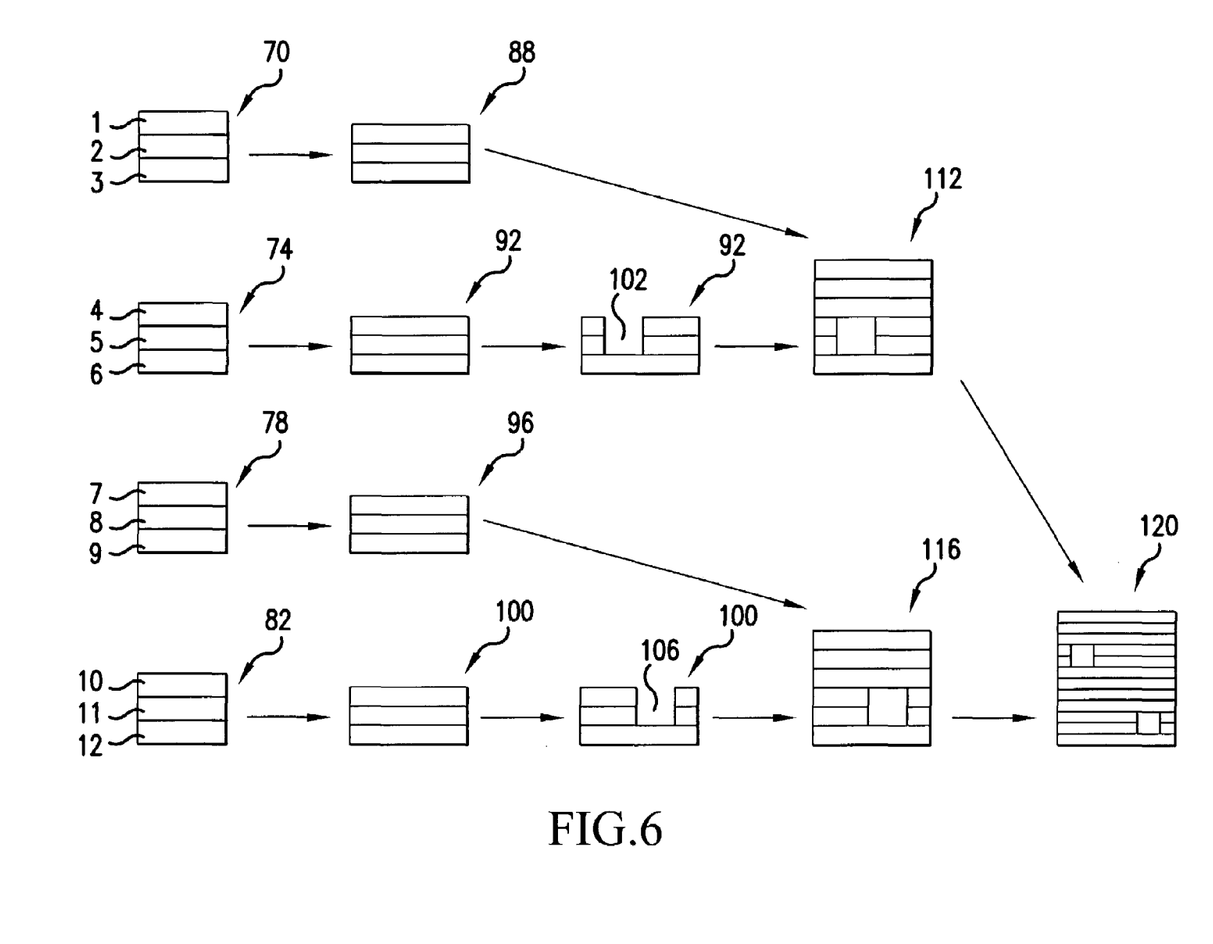
FIG. 6 schematically illustrates the structures formed by the process of FIG. 5.

A second embodiment of the invention is illustrated in FIGS. 5 and 6 wherein twelve sheets of green ceramic tape are again identified with reference numerals 1–12 and wherein elements common to both embodiments are identified with the same reference numerals.

After initial processing steps 208, a first stack 70 of three sheets 1–3 of green ceramic tape is formed at step 72, a second stack 74 of three sheets 4–6 is formed at step 76, a third stack 78 of three sheets 7–9 is formed at step 80, and a fourth stack 82 of three sheets 10–12 is formed at step 84. First stack 70 is tack laminated at a step 86 to form a first substructure 88, second stack 74 is tack laminated at a step 90 to form a second substructure 92, third stack 78 is tack laminated at a step 94 to form a third substructure 96 and fourth stack 82 is tack laminated at a step 98 to form a fourth substructure 100. Each of these tack lamination steps 86, 90, 94, 98 is carried out, for example, for about 15 minutes at a pressure of about 3000 psi.

Thereafter, the a pattern of openings, represented by a single opening 102, is formed in second substructure 92, such as by routing, at a step 104, and a pattern of openings, represented by a single opening 106, is formed in fourth substructure 100 at a step 108.

Next, first substructure 88 and routed second substructure 92 are stacked and tack laminated at a step 110 to form a first intermediate structure 112, and the third substructure 96 and routed fourth substructure 100 are stacked and tack laminated at a step 114 to form a second intermediate structure 116. These first and second intermediate substructures 112, 116 are each tack laminated, for example, for about 15 minutes at a pressure of about 2000 psi. At step 118 the first and second intermediate substructures 112, 116 are stacked and laminated for about 15 minutes at a pressure of about 1500 psi to form a panel 120, and finishing steps 218 are thereafter performed.

The method of this second embodiment improved the overall configuration and appearance of slots and openings in the finished panel. Delamination problems that occurred using prior processing methods were reduced as was the problem of corner cracking on the finished panels. While the disclosed process includes more processing steps than certain known LTCC fabrication processes, it is believed that the increased yield produced by these methods will result in an overall cost reduction. The average yield using the method of the second embodiment has been increased to 61 percent, a significant improvement over the sub-50% yields that resulted from certain other methods.

Figure 7:
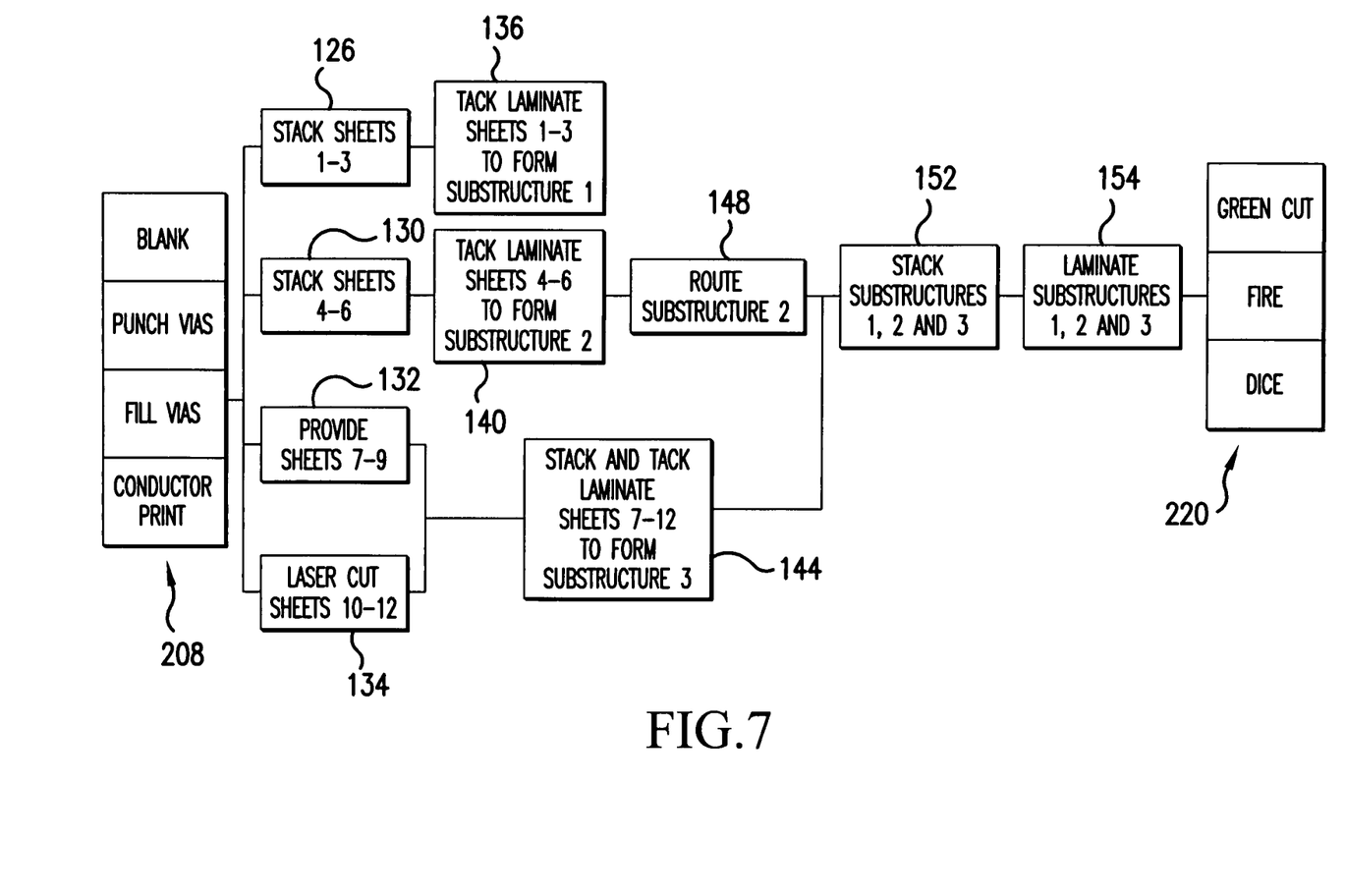
FIG. 7 is a flow chart illustrating a process for forming LTCC structures having cavities, slots, and/or sockets according to a third embodiment of the present invention.
Figure 8:
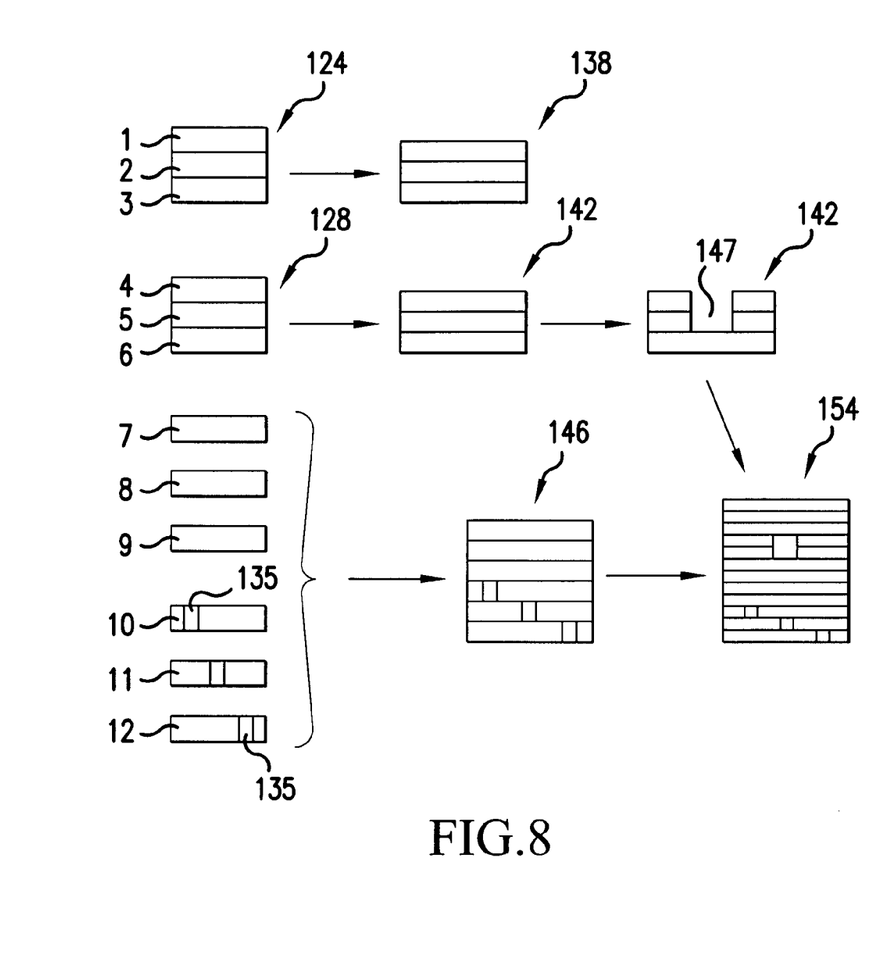
FIG. 8 schematically illustrates the structures formed by the process of FIG. 7.

FIGS. 7 and 8 illustrate a third embodiment of the invention in which twelve sheets 1–12 are stacked and laminated in a specific manner to provide a finished LTCC product. In this embodiment, a first stack 124 of three sheets 1, 2, 3 is formed at a step 126, a second stack 128 of three sheets 4, 5, 6 is formed at a step 130, a first set of three sheets 7, 8, 9 is provided at step 132 and a second set of three sheets 10, 11, 12 is provided at a step 134 and laser cut as necessary to form a desired pattern of openings 135 in the sheets.

First stack 124 is subjected to a pre-lamination or tack-laminating process at step 136 to partially consolidate the sheets into a first substructure 138. The tack lamination may be carried out, for example, for about 15 minutes at a pressure of about 3000 psi. This pressure and time are sufficient to partially bond the sheets of tape, but does not fully consolidate the sheets as is done in conventional lamination. The second stack 128 is tack laminated in a similar manner, for a similar time at a similar pressure, at a step 140 to form a second substructure 142. Sheets 7–12 are stacked and laminated at a step 144 to form a third substructure 146. Second substructure 142 is thereafter routed or otherwise processed to form a pattern of openings 147 therein at step 148.

Next, first substructure 138, second substructure 142 and third substructure 146 are stacked and laminated at steps 150, 152, for example, for 15 minutes at a pressure of about 1000 psi to form panel 154.

The present invention has been described herein with reference to several embodiments thereof. However, obvious modifications and additions to these embodiments will become apparent to those skilled in the relevant arts upon a reading of the foregoing description. It is intended that all such obvious modifications and variations form a part of the present invention to the extent that they fall within the scope of the several claims appended hereto.

What is claimed is:

1. A method of forming an LTCC structure comprising the steps of:
    laminating a first plurality of sheets of ceramic tape at a first pressure to form a first substructure;
    laminating a second plurality of sheets of ceramic tape at a second pressure to form a second substructure;
    laminating a third plurality of sheets of ceramic tape at a third pressure to form a third substructure;
    laminating the first substructure to the second substructure at a fourth pressure less than the first, second and third pressures to form a first intermediate structure; and
    laminating the third substructure and the first intermediate structure at a fifth pressure.

2. The method of claim 1 wherein the fifth pressure is less than the fourth pressure.

3. The method of claim 1 including the additional step of cutting an opening in the first substructure before laminating the first substructure to the second substructure.

4. A method of forming an LTCC structure comprising the steps of:
    laminating a first plurality of sheets of ceramic tape at a first pressure of about 3000 to 4000 psi to form a first substructure;
    laminating a second plurality of sheets of ceramic tape at a second pressure to form a second substructure;
    laminating a third plurality of sheets of ceramic tape at a third pressure to form a third substructure;
    laminating the first substructure to the second substructure at a fourth pressure to form a first intermediate structure; and
    laminating the third substructure and the first intermediate structure at a fifth pressure.

5. The method of claim 4 wherein the fourth pressure is about 2000 psi.

6. The method of claim 5 wherein the fifth pressure is about 1500 psi.

7. A method of forming an LTCC structure comprising the steps of:
    laminating a first plurality of sheets of ceramic tape at a first pressure to form a first substructure;
    laminating a second plurality of sheets of ceramic tape at a second pressure greater than said first pressure to form a second substructure;
    laminating a third plurality of sheets of ceramic tape at a third pressure to form a third substructure;
    laminating a fourth plurality of sheets of ceramic tape at a fourth pressure to form a fourth substructure;
    laminating the first substructure and the second substructure at a fifth pressure to form a first intermediate structure;
    laminating the third substructure and the fourth substructure at a sixth pressure to form a second intermediate structure; and
    laminating the first intermediate structure and second intermediate structure.

8. The method of claim 7 wherein the fifth pressure is less than the first pressure.

9. The method of claim 8 wherein the sixth pressure is less than the fifth pressure.

10. The method of claim 7 including the additional step of cutting an opening in the first substructure before laminating the first substructure to the second substructure.

11. The method of claim 10 including the additional step of cutting an opening in the third substructure before laminating the third substructure to the fourth substructure.

12. The method of claim 11 wherein said step of laminating the first intermediate structure and the second intermediate structure comprises the step of laminating the first intermediate structure and the second intermediate structure such that the opening in the first intermediate opening overlies a portion of the second intermediate structure.

13. A method of forming an LTCC structure comprising the steps of:
    laminating a first plurality of sheets of ceramic tape at a first pressure about 3000 to 4000 psi to form a first substructure;
    laminating a second plurality of sheets of ceramic tape at a second pressure to form a second substructure;
    laminating a third plurality of sheets of ceramic tape at a third pressure to form a third substructure;
    laminating a fourth plurality of sheets of ceramic tape at a fourth pressure to form a fourth substructure;
    laminating the first substructure and the second substructure at a fifth pressure to form a first intermediate structure;
    laminating the third substructure and the fourth substructure at a sixth pressure to form a second intermediate structure; and
    laminating the first intermediate structure and second intermediate structure.

14. The method of claim 13 wherein the fifth pressure is about 2000 psi.

15. The method of claim 14 wherein the sixth pressure is about 1500 psi.

16. The method of claim 13 wherein the first plurality of sheets comprises three sheets.

17. The method of claim 16 wherein the second plurality of sheets comprises three sheets.

18. The method of claim 17 wherein the third plurality of sheets comprises eight sheets.

19. The method of claim 18 wherein the fourth plurality of sheets comprise five sheets.

* * * * *